(12) United States Patent
Bhuiyan

(10) Patent No.: US 9,189,163 B2
(45) Date of Patent: Nov. 17, 2015

(54) DYNAMIC INTERFACE CALIBRATION FOR A DATA STORAGE DEVICE

(71) Applicant: SANDISK TECHNOLOGIES INC., Plano, TX (US)

(72) Inventor: Ekram Hossain Bhuiyan, San Jose, CA (US)

(73) Assignee: SANDISK TECHNOLOGIES INC., Plano, TX (US)

( * ) Notice: Subject to any disclaimer, the term of this patent is extended or adjusted under 35 U.S.C. 154(b) by 86 days.

(21) Appl. No.: 14/102,375

(22) Filed: Dec. 10, 2013

(65) Prior Publication Data

US 2015/0160866 A1  Jun. 11, 2015

(51) Int. Cl.
*G11C 7/10* (2006.01)
*G11C 11/4093* (2006.01)
*G11C 11/4074* (2006.01)
*G11C 11/4096* (2006.01)
*G06F 3/06* (2006.01)
*G11C 7/04* (2006.01)
*G11C 29/02* (2006.01)
*G06F 13/16* (2006.01)
*G11C 5/14* (2006.01)

(52) U.S. Cl.
CPC ............ *G06F 3/0611* (2013.01); *G06F 3/0656* (2013.01); *G06F 3/0688* (2013.01); *G06F 13/1694* (2013.01); *G11C 7/04* (2013.01); *G11C 29/022* (2013.01); *G11C 29/028* (2013.01); *G06F 2003/0691* (2013.01); *G06F 2003/0698* (2013.01); *G11C 5/147* (2013.01); *G11C 7/106* (2013.01); *G11C 7/1051* (2013.01); *G11C 7/1057* (2013.01); *G11C 7/1078* (2013.01); *G11C 7/1087* (2013.01); *G11C 11/4093* (2013.01); *G11C 2207/2254* (2013.01)

(58) Field of Classification Search
CPC .... G11C 7/106; G11C 7/1057; G11C 7/1087; G11C 11/4093; G11C 2207/2254; G11C 5/147; G11C 7/1051; G11C 7/1078
USPC ................ 365/189.05, 189.11, 233.5, 189.17
See application file for complete search history.

(56) References Cited

U.S. PATENT DOCUMENTS

| | | | | |
|---|---|---|---|---|
| 6,622,185 | B1 * | 9/2003 | Johnson et al. | 710/48 |
| 7,069,458 | B1 * | 6/2006 | Sardi et al. | 713/401 |
| 7,123,051 | B1 * | 10/2006 | Lee et al. | 326/40 |
| 7,188,263 | B1 * | 3/2007 | Rubinstein et al. | 713/300 |
| 7,283,070 | B1 | 10/2007 | Roy et al. | |
| 7,565,468 | B2 * | 7/2009 | Horowitz et al. | 710/104 |
| 7,983,094 | B1 * | 7/2011 | Roge et al. | 365/189.011 |
| 8,582,374 | B2 | 11/2013 | Mozak et al. | |
| 2002/0018537 | A1 * | 2/2002 | Zielbauer | 375/377 |
| 2003/0046596 | A1 | 3/2003 | Floyd et al. | |
| 2008/0168298 | A1 * | 7/2008 | Bellows et al. | 713/601 |
| 2010/0162037 | A1 * | 6/2010 | Maule et al. | 714/5 |
| 2013/0343401 | A1 * | 12/2013 | Dickson et al. | 370/419 |
| 2014/0032799 | A1 * | 1/2014 | Dickson et al. | 710/104 |
| 2014/0075146 | A1 * | 3/2014 | Lee et al. | 711/170 |
| 2014/0149775 | A1 * | 5/2014 | Ware | 713/323 |

* cited by examiner

*Primary Examiner* — Ly D Pham
(74) *Attorney, Agent, or Firm* — Toler Law Group, PC

(57) ABSTRACT

A data storage device includes a memory and a controller. A method includes calibrating a first portion of the interface in response to a first bit transition from a first bit value to a second bit value of data to be sent via the interface.

22 Claims, 3 Drawing Sheets

DYNAMIC INTERFACE CALIBRATION FOR A DATA STORAGE DEVICE

FIELD OF THE DISCLOSURE

The present application is generally related to data storage devices and more particularly to interface calibration for data storage devices.

BACKGROUND

Non-volatile data storage devices, such as embedded memory devices and removable memory devices, have enabled increased portability of data and software applications. For example, multi-level cell (MLC) storage elements of a flash memory device may each store multiple bits of data, enhancing data storage density as compared to single-level cell (SLC) flash memory devices. As a result, flash memory devices may enable users to store and access a large amount of data. The data may be accessed by a host device (e.g., a computing device) via an interface, such as an input/output (I/O) interface, which may facilitate communication between the host device and the flash memory device.

SUMMARY

A data storage device may include a host interface having an output driver that sends data to a host device. The data storage device may include an interface calibration engine that calibrates the output driver, such as to adjust a "drive strength" of the output driver to compensate for temperature and voltage variations at the host interface during operation of the data storage device. The calibration engine may dynamically calibrate portions of the output driver while sending data to the host device via the host interface. For example, in response to a first bit transition of data from a "1" bit value to a "0" bit value, the calibration engine may calibrate a first portion of the output driver (e.g., a pull-up driver) while a second portion of the output driver (e.g., a pull-down driver) sends a "0" bit to the host device. The first portion may be inactive (e.g., not sending data to the host device) while the second portion sends the "0" bit to the host device. As another example, in response to a second bit transition from a "0" bit value to a "1" bit value, the calibration engine may calibrate the second portion of the output driver while the first portion of the output driver sends a "1" bit to the host device. The second portion may be inactive while the first portion sends the "1" bit to the host device.

Dynamically calibrating the output driver may improve performance of the data storage device, such as by avoiding latency that results from idling the output driver during calibration. In addition, dynamically calibrating the output driver may improve calibration accuracy. For example, conditions at the host interface while sending data may not match conditions at the host interface during an idle mode of operation. Calibrating the output driver during the idle mode may therefore result in a performance "mismatch" in which one or more actual operating conditions of the host interface are not accounted for during calibration. By dynamically calibrating the output driver, performance mismatch can be reduced or avoided. Alternatively or in addition, calibration techniques described herein may be used in connection with one or more other interfaces, such as an interface between a controller of the data storage device and a memory of the data storage device.

DETAILED DESCRIPTION

Figure 1:
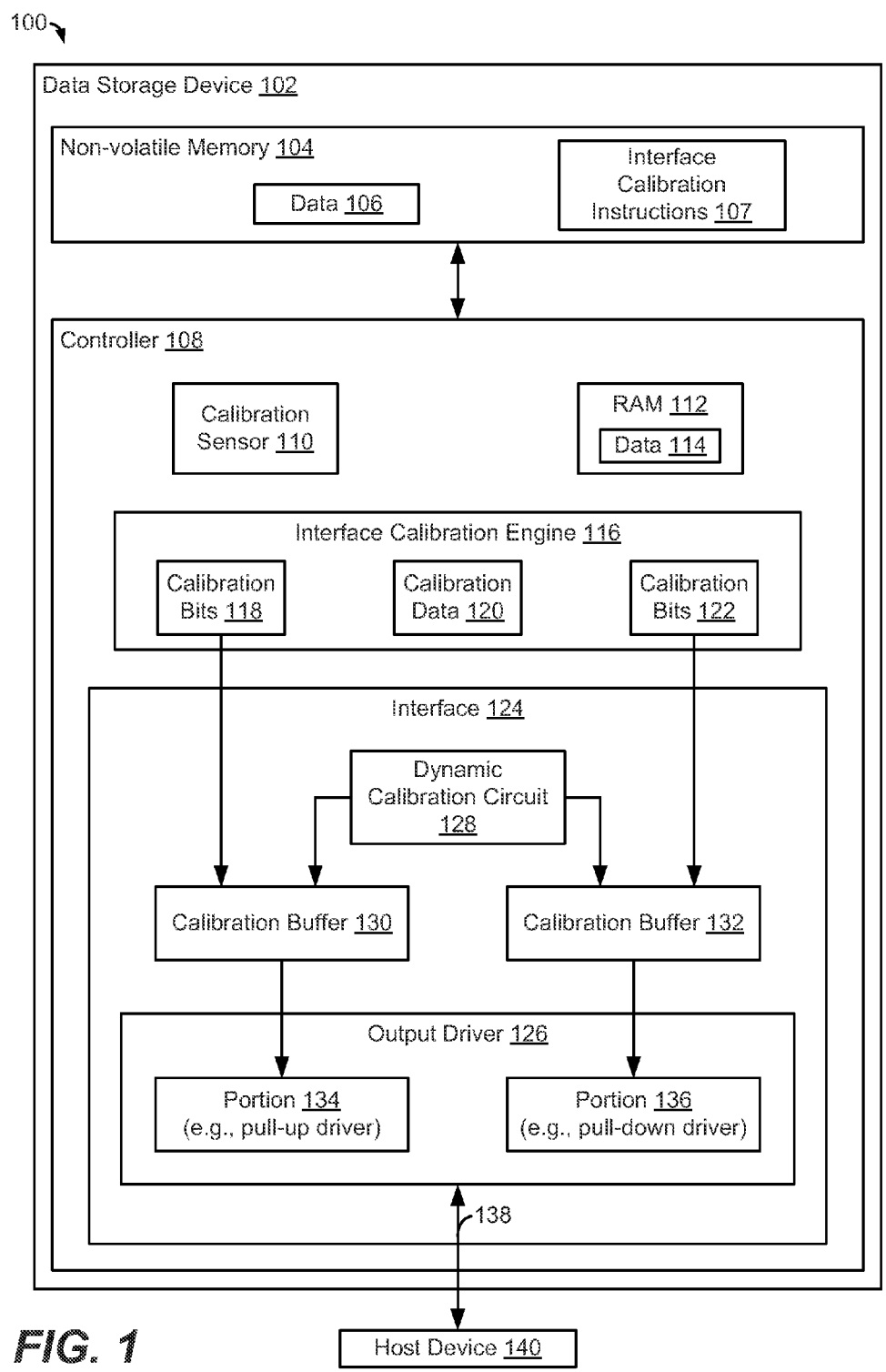
FIG. 1 is a block diagram of a particular illustrative embodiment of an electronic device that includes a data storage device having an output driver.

Referring to FIG. 1, a particular illustrative embodiment of an electronic device is depicted and generally designated 100. The electronic device 100 includes a data storage device 102 and a host device 140. The data storage device 102 may be embedded within the host device 140, such as in accordance with a Joint Electron Devices Engineering Council (JEDEC) Solid State Technology Association Universal Flash Storage (UFS) configuration. Alternatively, the data storage device 102 may be removable from (i.e., "removably" coupled to) the host device 140. For example, the data storage device 102 may be removably coupled to the host device 140 in accordance with a removable universal serial bus (USB) configuration.

The data storage device 102 may include a memory, such as a non-volatile memory 104, and a controller 108. The non-volatile memory 104 may be configured to store data, such as data 106. The non-volatile memory 104 may store instructions, such as interface calibration instructions 107.

The controller 108 may include one or more calibration sensors, such as a calibration sensor 110, a random access memory (RAM) 112, an interface calibration engine 116, and an interface 124, such as an input/output (I/O) interface (or a portion thereof, such as an output interface portion of an I/O interface). The RAM 112 may be configured to store data, such as data 114. The calibration sensor 110 may include one or more sensors or circuits configured to determine a temperature associated with the interface 124, to determine a voltage associated with the interface 124, to determine an impedance associated with the interface 124, to determine a data rate associated with the interface 124, or a combination thereof, as illustrative examples. The calibration sensor 110 may generate calibration data 120 indicating the temperature associated with the interface 124, the voltage associated with the interface 124, the impedance associated with the interface 124, the data rate associated with the interface 124, or a combination thereof.

The interface calibration engine 116 may be responsive to the calibration sensor 110. For example, the interface calibration engine 116 may receive the calibration data 120 from the calibration sensor 110. The interface calibration engine 116 may be configured to generate calibration bits based on the calibration data 120 to calibrate the interface 124. For example, the interface calibration engine 116 may be configured to generate calibration bits 118 and calibration bits 122.

The interface 124 may include an output driver 126, a dynamic calibration circuit 128, a calibration buffer 130, and a calibration buffer 132. The output driver 126 may include a portion 134 (e.g., a pull-up driver) and a portion 136 (e.g., a pull-down driver). The output driver 126 may be coupled to the host device 140 via one or more connections, such as a connection 138.

The controller 108 is configured to send data and commands to the non-volatile memory 104 and to receive data from the non-volatile memory 104. For example, the controller 108 is configured to send data and a write command to cause the non-volatile memory 104 to store data to a specified address of the non-volatile memory 104. The controller 108 is configured to send a read command to read data from a specified address of the non-volatile memory 104. As a particular example, the controller 108 may send a read command to sense the data 106 from the non-volatile memory 104. In a particular embodiment, the controller 108 is configured to decode the data 106, such as using an error correcting code (ECC) engine of the controller 108, to generate the data 114.

The controller 108 is configured to receive data and instructions from the host device 140 and to send data to the host device 140. For example, the controller 108 may send data to the host device 140 via the interface 124 and may receive data from the host device 140 via the interface 124. The controller 108 may store (e.g., buffer) data at a cache or a memory, such as at the RAM 112. As a particular example, the controller 108 may store the data 114 at the RAM 112 prior to sending the data 114 to the host device 140 via the output driver 126.

The host device 140 may correspond to a mobile telephone, a music player, a video player, a gaming console, an electronic book reader, a personal digital assistant (PDA), a computer, such as a laptop computer, tablet, or notebook computer, another electronic device, or a combination thereof. The host device 140 may communicate via a host controller, which may enable the host device 140 to communicate with the controller 108 to read data from the non-volatile memory 104 and to write data to the non-volatile memory 104. The host device 140 may operate in compliance with a JEDEC Solid State Technology Association industry specification, such as an embedded MultiMedia Card (eMMC) specification or a Universal Flash Storage (UFS) Host Controller Interface specification. The host device 140 may operate in compliance with one or more other specifications, such as a Secure Digital (SD) Host Controller specification as an illustrative example. The host device 140 may communicate with the data storage device 102 in accordance with another suitable communication protocol.

In operation, the controller 108 may dynamically calibrate the output driver 126. For example, the calibration sensor 110 may be configured to determine a temperature change at the interface 124, a voltage change at the interface 124, an impedance change at the interface 124, or a data rate change at the interface 124, as illustrative examples. The calibration sensor 110 may be configured to provide information, such as the calibration data 120, to the interface calibration engine 116.

The interface calibration engine 116 may be responsive to the calibration sensor 110 to generate the calibration bits 118, 122. For example, the interface calibration engine 116 may generate the calibration bits 118, 122 based on the calibration data 120. The interface calibration engine 116 may provide the calibration bits 118, 122 to the interface 124, such as to the calibration buffers 130, 132, respectively.

To illustrate, in a particular embodiment, the interface calibration engine 116 executes the interface calibration instructions 107 to compare the calibration data 120 to an operating range (e.g., a particular range of acceptable values for each parameter measured by the calibration sensor 110) indicated by the interface calibration instructions 107. The controller 108 may access the interface calibration instructions 107 from the non-volatile memory 104 and may store the interface calibration instructions 107 at the RAM 112. Alternatively, the interface calibration instructions 107 may be included in the interface calibration engine 116 (e.g., as firmware).

The interface calibration engine 116 may execute the interface calibration instructions 107 to compare the calibration data 120 to the operating range. If the comparison indicates that the operating parameters of the interface 124 indicated by the calibration data 120 are within the operating range, the interface calibration engine 116 may not calibrate (or may not re-calibrate) the interface 124 in response to the comparison. If the comparison indicates that one or more parameters of the interface 124 are outside the operating range, the interface calibration engine 116 may adjust or calibrate the interface 124. For example, the interface calibration engine 116 may generate the calibration bits 118, 122 to compensate for one or more parameters of the interface 124 deviating from the operating range, such as by adjusting a drive strength of the output driver 126 using the calibration bits 118.

The dynamic calibration circuit 128 may be configured to cause the calibration buffers 130, 132 to selectively buffer the calibration bits 118, 122, respectively. As a particular illustrative example, if the output driver 126 is to send the data 114 to the host device 140, the dynamic calibration circuit 128 may cause the calibration buffer 130 to buffer (e.g., latch in) the calibration bits 118 while the portion 136 of the output driver 126 is sending a bit of the data 114 that has a first bit value. As another example, the dynamic calibration circuit 128 may cause the calibration buffer 132 to buffer (e.g., latch in) the calibration bits 122 while the portion 134 of the output driver 126 sends a bit of the data 114 that has a second bit value to the host device 140.

The calibration bits 118, 122 may calibrate the portions 134, 136 of the output driver 126 according to a suitable technique. As a particular example, the calibration bits 118 may be used to activate a particular number of transistors of the portion 134 of the output driver 126, such as to calibrate an output impedance of the portion 134. The calibration bits 122 may be used to select a particular number of transistors of the portion 136 of the output driver 126, such as to calibrate an output impedance of the portion 136. Alternatively or in addition, the calibration bits 118, 122 may calibrate a voltage used by the output driver 126, such as to compensate for a temperature (or a change in temperature) at the interface 124. Alternatively or in addition, the calibration bits 118, 122 may calibrate a data rate at the interface 124, such as by calibrating a voltage used by the output driver 126.

The techniques illustrated with reference to FIG. 1 enable dynamic calibration of the output driver 126. For example, by calibrating the portion 134 of the output driver 126 while the portion 136 of the output driver 126 is active, a latency associated with idling the output driver 126 during calibration can be avoided. Further, the techniques of FIG. 1 enable more precise calibration of an output driver. For example, because data is sent via the portion 136 of the output driver 126 while the portion 134 of the output driver 126 is calibrated, a "mismatch" due to calibrating the output driver 126 based on an idle state that is different from an active state of the output driver 126 can be avoided.

Figure 2:
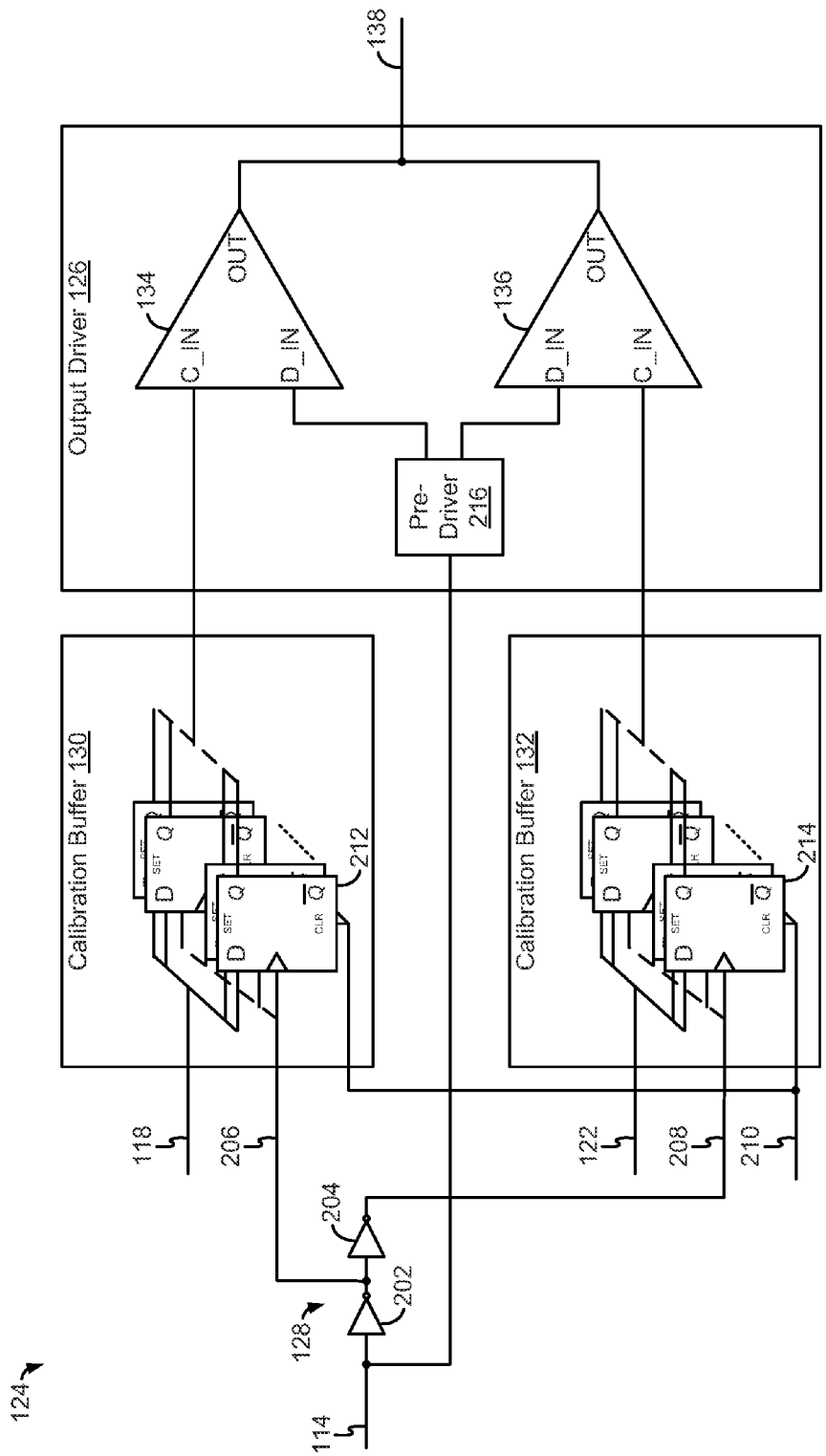
FIG. 2 is a block diagram of a particular illustrative embodiment of an output driver that may be used as the output driver of FIG. 1.

FIG. 2 depicts a particular illustrative embodiment of an interface that may be used as the interface 124. The interface 124 may include the dynamic calibration circuit 128, the calibration buffer 130, the calibration buffer 132, and the output driver 126. The output driver 126 may include the portion 134 and the portion 136. The output driver 126 may be coupled to the connection 138, as illustrated.

The dynamic calibration circuit 128 may include an inverter 202 and an inverter 204. The inverter 202 may be configured to generate an enable signal 206 based on the data 114. For example, the inverter 202 may invert a first bit value of the data 114 to generate a second bit value of the enable signal 206. The inverter 204 may be configured to generate an enable signal 208 based on the data 114. For example, the inverter 204 may invert the second bit value of the enable signal 206 to generate a first bit value of the enable signal 208. Accordingly, the enable signals 206, 208 may correspond to complementary signals.

The calibration buffer 130 may include one or more registers. In the example of FIG. 2, the calibration buffer 130 includes a register having multiple latches each responsive to a respective bit of the calibration bits 118. For example, FIG. 2 depicts that the calibration buffer 130 may include a latch 212. The latch 212 may include an enable input that is responsive to the enable signal 206. The latch 212 may further include a data input that is responsive to one of the calibration bits 118.

The calibration buffer 132 may include one or more registers. In the example of FIG. 2, the calibration buffer 132 includes multiple latches each responsive to a respective bit of the calibration bits 122. For example, FIG. 2 depicts that the calibration buffer 132 may include a latch 214. The latch 214 may include an enable input responsive to the enable signal 208 and may further include a data input that is responsive to one of the calibration bits 122. One or both of the calibration buffers 130, 132 may be responsive to a reset signal 210.

The output driver 126 may include the portion 134, the portion 136, and a pre-driver 216. The portions 134, 136 may each include a calibration input (C_IN), a data input (D_IN), and a data output (OUT). In a particular embodiment, the portion 134 corresponds to a pull-up driver configured to send bits having a logical "1" bit value, and the portion 136 corresponds to a pull-down driver configured to send bits having a logical "0" bit value. For example, the portion 134 may include one or more p-type metal-oxide-semiconductor field-effect transistors (pMOSFETs) configured to "pull up" a voltage at the connection 138 when the data 114 has a logical "1" bit value. The portion 136 may include multiple n-type metal-oxide-semiconductor field-effect transistors (nMOSFETs) configured to "pull down" a voltage at the connection 138 when the data 114 has a logical "0" bit value.

In operation, the interface calibration engine 116 may provide the calibration bits 118, 122 to the calibration buffers 130, 132, respectively. For example, a calibration bit of the calibration bits 118 may be provided to a data input of the latch 212. As another example, a calibration bit of the calibration bits 122 may be provided to a data input of the latch 214. The calibration bits 118, 122 may be buffered at the inputs of the latches of the calibration buffers 130, 132 until latched into the latches based on bit transitions of the data 114, as described further below.

To further illustrate, while the data 114 has a logical "0" bit value, the portion 136 may be active, and the portion 134 may be inactive. In response to a first bit transition of the data 114 from the logical "0" bit value to a logical "1" bit value, the pre-driver 216 may activate the portion 134 to send the logical "1" bit value via the connection 138 and may deactivate the portion 136. Further, in response to the first bit transition of the data 114, the enable signal 208 has a logical "1" bit value, activating the calibration buffer 132, such as by activating enable inputs of latches of the calibration buffer 132. In response to activating the calibration buffer 132, the calibration bits 122 may be latched into the calibration buffer 132 while the portion 136 is inactive and while the portion 134 is active (e.g., while the portion 134 is sending a logical "1" bit value via the connection 138). The calibration buffer 132 may output the calibration bits 122 (e.g., via "Q" outputs of latches of the calibration buffer 132) to the calibration input (C_IN) of the portion 136 to calibrate the portion 136 while the portion 136 is inactive and while the portion 134 is active.

In response to a second bit transition of the data 114 from the logical "1" bit value to the logical "0" bit value, the enable signal 208 has a logical "0" bit value, deactivating the calibration buffer 132, such as by deactivating enable inputs of latches of the calibration buffer 132. In response to the second bit transition of the data 114, the pre-driver 216 may activate the portion 136 (e.g., to send a logical "0" bit value via the connection 138) and may deactivate the portion 134. While the portion 136 is active, the calibration bits 118 may be latched into the calibration buffer 130. The calibration bits 118 are latched into the calibration buffer 130 in response to the second bit transition of the data 114. The calibration buffer 130 may output the calibration bits 118 (e.g., via "Q" outputs of latches of the calibration buffer 130) to the calibration input (C_IN) of the portion 134 to calibrate the portion 134 while the portion 134 is inactive and while the portion 136 is active.

While the sending the data 114, the interface calibration engine 116 may continue to calibrate one or more portions of the output driver 126. For example, the calibration sensor 110 may periodically or occasionally re-measure conditions at the interface 124 (e.g., temperature, voltage, impedance, and/or data rate, as illustrative examples) and generate updated calibration data based on the measurements. The interface calibration engine 116 may re-calibrate the output driver 126 by generating updated calibration bits based on the updated calibration data (e.g., by re-executing the interface calibration instructions 107 based on the updated calibration data to generate the updated calibration bits).

Dynamically calibrating the output driver 126 as described with reference to FIG. 2 may improve performance of the data storage device 102 without introducing signal distortion that can be caused by interface calibration. For example, calibration of the portion 134 while the portion 134 is active could result in signal distortion at the connection 138 (e.g., by introducing spurious signals at the connection 138). The techniques of FIG. 2 advantageously calibrate the portion 134 while the portion 134 is inactive (and while the portion 136 is active). Similarly, the portion 136 may be calibrated while the portion 136 is inactive and while the portion 134 is active. The techniques of FIG. 2 therefore enable dynamic calibration of the output driver 126 without introducing signal distortion at the connection 138 that could corrupt data and reduce performance of the data storage device 102.

Figure 3:
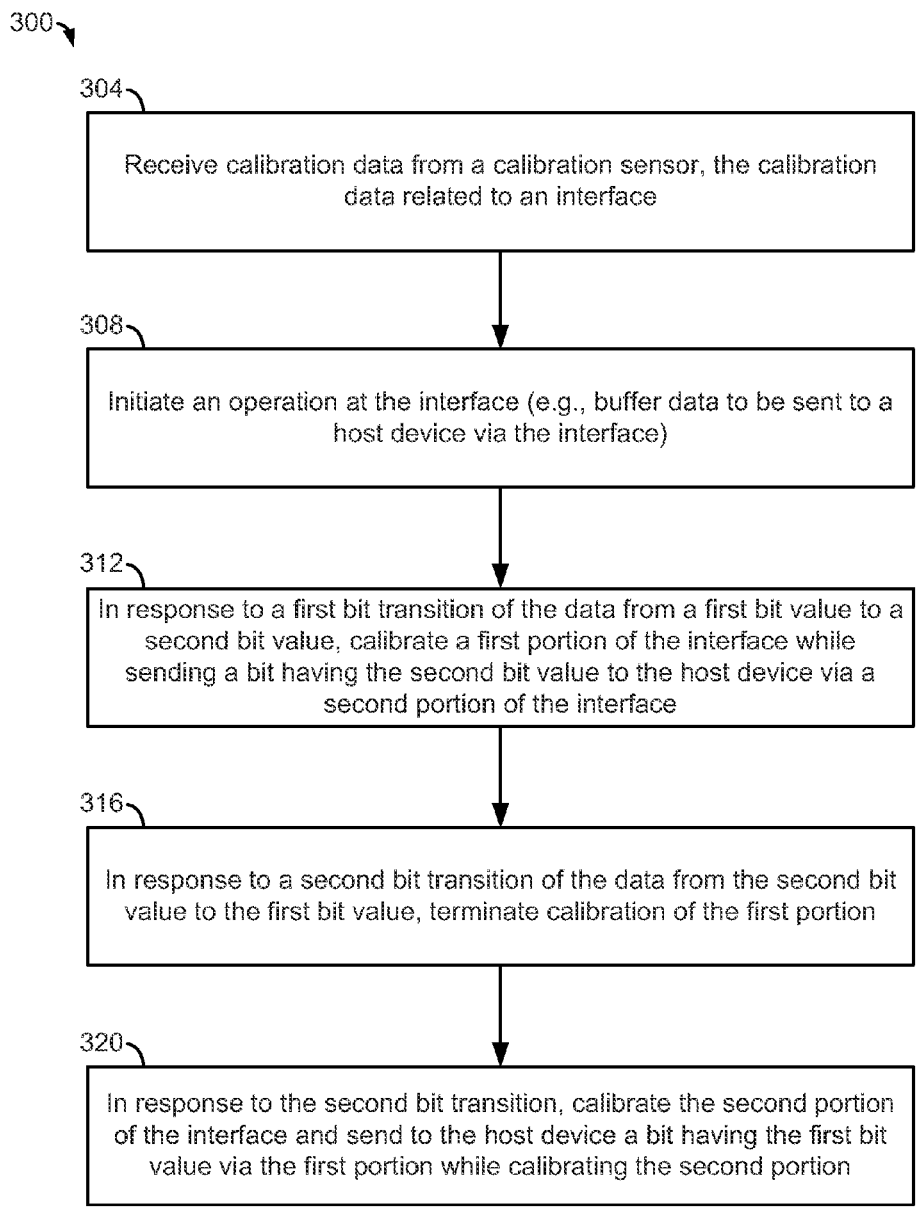
FIG. 3 is a flow diagram of a particular illustrative embodiment of a method of operation of a data storage device, such as the data storage device of FIG. 1.

Referring to FIG. 3, a particular illustrative embodiment of a method is depicted and generally designated 300. The method 300 may be performed in a data storage device, such as in the data storage device 102 by the controller 108.

The method 300 may include receiving calibration data from a calibration sensor, at 304. The calibration data is related to an interface. The calibration data may correspond to the calibration data 120, and the interface may correspond to the interface 124. The calibration sensor may correspond to the calibration sensor 110. The calibration data may indicate a temperature at the interface, a voltage of the interface, an impedance of the interface, a data rate of the interface, or a combination thereof.

The method 300 may further include initiating an operation at the interface, at 308. The operation may include sending data to a host device, such as the host device 140. The data may be read from the non-volatile memory 104 and buffered at the RAM 112. The data may correspond to the data 114.

The method 300 may further include calibrating a first portion of the interface while sending a bit having a second bit value in response to a first bit transition of the data from a first bit value to the second bit value, at 312. The bit may be sent to the host device via a second portion of the interface. The first portion may correspond to the portion 134, and the second portion may correspond to the portion 136. The first portion may be calibrated using the calibration bits 118. In a particular embodiment, the calibration bits 118 are latched into the calibration buffer 130 in response to the first bit transition. The first portion may be calibrated to compensate for a temperature change at the interface, to adjust a voltage of the interface, to adjust an impedance of the interface, to adjust a data rate of the interface, or a combination thereof.

The method 300 may further include terminating calibration of the first portion in response to a second bit transition of the data from the second bit value to the first bit value, at 316. For example, the calibration buffer 130 may be deactivated via the enable signal 206.

The method 300 may further include calibrating the second portion of the interface and sending to the host device a bit having the first bit value via the first portion while calibrating the second portion in response to the second bit transition, at 320. The second portion may be calibrated using the calibration bits 122. In a particular embodiment, the calibration bits 122 are latched into the calibration buffer 132 in response to the second bit transition. The second portion may be calibrated to compensate for a temperature change at the interface, to adjust a voltage of the interface, to adjust an impedance of the interface, to adjust a data rate of the interface, or a combination thereof.

Use of the method 300 of FIG. 3 may avoid latency that results from idling an output driver during calibration. For example, because the portion 134 may be active while the portion 136 is calibrated (and vice versa), throughput associated with the data storage device 102 is improved as compared to a system in which an interface is idled during calibration. The method 300 may therefore enable faster access to data stored at the non-volatile memory 104, such as by sending data via the portion 134 while the portion 136 is calibrated (or vice versa) instead of calibrating the output driver 126 while the output driver 126 is idle.

In a particular illustrative embodiment, the interface calibration engine 116 is further configured to dynamically calibrate an active portion of the output driver 126 in response to a string of consecutive same bit values of the data 114 during which no bit transition is to occur. For example, the interface calibration engine 116 may analyze the data 114 to identify a sequence of a particular number of same bit values, such as n or more consecutive "0" bit values or n or more consecutive "1" bit values, where n indicates a particular positive integer.

To illustrate, if the data 114 includes a sequence of "0" bit values during which no bit transition is to occur, the interface calibration engine 116 may dynamically update the calibration bits 122 while the portion 136 is sending the sequence of "0" bit values. Dynamically updating the calibration bits 122 while the portion 136 is sending the sequence of "0" bit values may not result in signal distortion at the connection 138 (or may result in a tolerable amount of signal distortion), particularly in an implementation in which bit transitions are more susceptible to signal distortion than a string of n same bit values. Further, the calibration bits 118 buffered at the calibration buffer 130 may be updated during the sequence of n "0" bit values if new calibration bits have been generated by the interface calibration engine 116 since buffering the calibration bits 118.

To further illustrate, if the data 114 includes a sequence of n "1" bit values during which no bit transition is to occur, the interface calibration engine 116 may dynamically update the calibration bits 118 while the portion 134 is sending the sequence of "1" bit values. Dynamically updating the calibration bits 118 while the portion 134 is sending the sequence of "1" bit values may not result in signal distortion at the connection 138 (or may result in a tolerable amount of signal distortion), particularly in an implementation in which bit transitions are more susceptible to signal distortion than a string of n same bit values. Further, the calibration bits 122 buffered at the calibration buffer 132 may be updated during the sequence of "1" bit values if new calibration bits have been generated by the interface calibration engine 116 since buffering the calibration bits 122.

Although certain structures and operations have been described herein with reference to the interface 124 for convenience, it will be appreciated that such structures and operations may be applied to one or more other interfaces alternatively or in addition to the interface 124. For example, the controller 108 may include an interface to the non-volatile memory 104. The interface to the non-volatile memory 104 may correspond to the interface 124. The interface to the non-volatile memory 104 may be responsive to the interface calibration engine 116. As another example, the non-volatile memory 104 may include an interface to the controller 108. The interface to the controller 108 may correspond to the interface 124. The interface calibration engine 116 may send data and/or commands to the non-volatile memory 104 to calibrate the interface to the controller 108 in a manner illustrated by one or more techniques described herein. As another example, the host device 140 may include an interface to the data storage device 102. The interface to the data storage device 102 may correspond to the interface 124. The host device 140 may include an interface calibration engine that corresponds to the interface calibration engine 116. To further illustrate, one or more operations of the method 300 may be performed with respect to one or more of the interface 124, the interface to the non-volatile memory 104, the interface to the controller 108, and the interface to the data storage device.

Although one or more components described herein are illustrated as block components and described in general terms, such components may include one or more microprocessors, state machines, or other circuits configured to enable the controller 108 (or one or more components thereof) to perform operations described herein. For example, one or more components described herein may correspond to one or more physical components, such as hardware controllers, state machines, logic circuits, one or more other structures, or a combination thereof, to enable the controller 108 to perform one or more operations described herein. One or more aspects of the controller 108 may be implemented using a microprocessor or microcontroller programmed to perform operations described herein, such as one or more operations of the method 300. In a particular embodiment, the controller 108 includes a processor executing instructions that are stored at the non-volatile memory 104. Alternatively or in addition, executable instructions that are executed by the processor may be stored at a separate memory location that is not part of the non-volatile memory 104, such as at a read-only memory (ROM).

To further illustrate, a processor of the controller 108 may be configured to execute instructions, such as the interface calibration instructions 107, to calibrate a first portion of the interface in response to a first bit transition from a first bit value to a second bit value of data to be sent via the interface. The processor may be responsive to the calibration data 120 generated by the calibration sensor 110. The processor may analyze the calibration data 120 to determine how (or if) the portions 134, 136 are to be calibrated (e.g., by executing a subroutine of the interface calibration instructions 107 that analyzes the calibration data 120, such as by analyzing whether the calibration data 120 deviates from a target or acceptable data range). The processor may generate the calibration bits 118, 122 based on the calibration data 120 (e.g., to adjust a drive strength of the output driver 126 to compensate for deviation from the acceptable data range). The processor may provide the calibration bits 118, 122 to the calibration buffers 130, 132, respectively. The processor may provide the data 114 to the output driver 126 (e.g., by executing one or more instructions to copy the data 114 from the RAM 112 to the output driver 126). The portions 134, 136 may be selectively and alternatively calibrated using the calibration bits 118, 122 in response to bit transitions of the data 114, as described with reference to FIG. 2.

In a particular embodiment, the data storage device 102 may be embedded within or attached to one or more host devices, such as within a housing of a host communication device, which may correspond to the host device 140. For example, the data storage device 102 may be integrated within a packaged apparatus such as a wireless telephone, a personal digital assistant (PDA), a gaming device or console, a portable navigation device, or other device that uses internal non-volatile memory. However, in other embodiments, the data storage device 102 may be implemented in a portable device configured to be selectively coupled to one or more external devices, such as the host device 140.

To further illustrate, the data storage device 102 may be configured to be coupled to the host device 140 as embedded memory, such as in connection with an embedded MultiMedia Card (eMMC®) (trademark of JEDEC Solid State Technology Association, Arlington, Va.) configuration, as an illustrative example. The data storage device 102 may correspond to an eMMC device. As another example, the data storage device 102 may correspond to a memory card, such as a Secure Digital (SD®) card, a microSD® card, a miniSD™ card (trademarks of SD-3C LLC, Wilmington, Del.), a MultiMediaCard™ (MMC™) card (trademark of JEDEC Solid State Technology Association, Arlington, Va.), or a CompactFlash® (CF) card (trademark of SanDisk Corporation, Milpitas, Calif.). The data storage device 102 may operate in compliance with a JEDEC industry specification. For example, the data storage device 102 may operate in compliance with a JEDEC eMMC specification, a JEDEC Universal Flash Storage (UFS) specification, one or more other specifications, or a combination thereof.

The non-volatile memory 104 may include a three-dimensional (3D) memory, a flash memory (e.g., a NAND memory, a NOR memory, a single-level cell (SLC) flash memory, a multi-level cell (MLC) flash memory, a divided bit-line NOR (DINOR) memory, an AND memory, a high capacitive coupling ratio (HiCR) device, an asymmetrical contactless transistor (ACT) device, or another flash memory), an erasable programmable read-only memory (EPROM), an electrically-erasable programmable read-only memory (EEPROM), a read-only memory (ROM), a one-time programmable memory (OTP), or a combination thereof. Alternatively or in addition, the non-volatile memory 104 may include another type of memory.

The illustrations of the embodiments described herein are intended to provide a general understanding of the various embodiments. Other embodiments may be utilized and derived from the disclosure, such that structural and logical substitutions and changes may be made without departing from the scope of the disclosure. This disclosure is intended to cover any and all subsequent adaptations or variations of various embodiments. Those of skill in the art will recognize that such modifications are within the scope of the present disclosure.

The above-disclosed subject matter is to be considered illustrative, and not restrictive, and the appended claims are intended to cover all such modifications, enhancements, and other embodiments, that fall within the scope of the present disclosure. Thus, to the maximum extent allowed by law, the scope of the present invention is to be determined by the broadest permissible interpretation of the following claims and their equivalents, and shall not be restricted or limited by the foregoing detailed description.

What is claimed is:

1. A device comprising:
a memory configured to store data; and
a controller configured to calibrate a first portion of an interface in response to a first bit transition of the data from a first bit value to a second bit value and configured to send the data by way of a second portion of the interface, the second portion different than the first portion.

2. The device of claim 1, wherein a second bit is sent via the interface while the first portion of the interface is being calibrated.

3. The device of claim 1, wherein the controller is further configured, in response to a second bit transition of the data from the second bit value to the first bit value, to terminate calibration of the first portion of the interface and to calibrate the second portion of the interface while a second bit is sent via the interface.

4. The device of claim 1, wherein the first portion of the interface is inactive and the second portion of the interface is active while the first portion of the interface is calibrated.

5. The device of claim 1, wherein the first portion of the interface includes a driver of the interface, and wherein the controller is further configured to concurrently calibrate the first portion and send the data.

6. The device of claim 5, wherein the driver is a pull-up driver configured to send bits having a logical one bit value or a pull-down driver configured to send bits having a logical zero bit value.

7. The device of claim 1, wherein the controller is further configured to calibrate the first portion of the interface by sending a calibration bit to the first portion of the interface.

8. The device of claim 7, wherein, in response to the calibration bit, the first portion of the interface is adjusted to compensate for a temperature change at the interface, to change a voltage of the interface, to change an impedance of the interface, to change a data rate of the interface, or a combination thereof.

9. The device of claim 1, wherein the interface is an input/output (I/O) interface that includes an output driver, and wherein the output driver includes the first portion of the interface.

10. The device of claim 3, wherein the second bit is sent to another device via the first portion of the interface, the second bit having the first bit value.

11. A system comprising:
a driver that includes a first portion and a second portion; and
a memory configured to store data,
wherein the first portion of the driver is configured to be calibrated in response to a first bit transition of the data from a first bit value to a second bit value,
wherein the second portion of the driver is configured to send the data, and wherein the second portion is different than the first portion.

12. The system of claim 11, further comprising:
a controller configured to send the data to the memory or to receive the data from the memory; and
a calibration buffer,
wherein the calibration buffer is configured to store calibration data,
wherein the first portion includes a pull-up driver or a pull-down driver, and
wherein the controller is configured to selectively calibrate the first portion according to the calibration data.

13. The system of claim 12, wherein the controller is configured to calibrate the first portion by sending a first plurality of calibration bits to the first portion.

14. The system of claim 11, further comprising:
a host device; and
a controller,
wherein the controller is configured to:
adjust a drive strength of the first portion based on calibration data, and
send the data to the host device via the second portion.

15. The system of claim 11, wherein the first portion comprises a low output driver, and wherein the second portion comprises a high output driver.

16. An apparatus comprising:
means for storing data; and
means for controlling the means for storing, wherein the means for controlling includes a
first portion and a second portion, and wherein the means for controlling is configured to:
calibrate the first portion in response to a first bit transition of the data from a first bit value to a second bit value; and
send the data by way of the second portion, wherein the second portion is different than the first portion.

17. The apparatus of claim 16, wherein the means for controlling is further configured to send to a host device a bit having the second bit value via the second portion while calibrating the first portion.

18. The apparatus of claim 17, wherein the means for controlling is further configured to, in response to a second bit transition of the data from the second bit value to the first bit value:
terminate calibration of the first portion;
calibrate the second portion; and
send to the host device a bit having the first bit value via the first portion while calibrating the second portion.

19. The apparatus of claim 16, further comprising an interface configured to send the data to a host device, wherein the first portion is inactive and the second portion is active while the first portion is calibrated, and wherein the first portion is active and the second portion is inactive while the second portion is calibrated.

20. The apparatus of claim 16, wherein the means for controlling is configured to:
send a first plurality of calibration bits to the first portion; and
calibrate the second portion by sending a second plurality of calibration bits to the second portion.

21. The apparatus of claim 16, further comprising a calibration buffer associated with the first portion, wherein the means for controlling is configured to latch a calibration bit into a latch of the calibration buffer in response to an enable signal, the enable signal generated by the means for controlling based on the second bit value.

22. The apparatus of claim 16, wherein the first portion includes a pull-up driver or a pull-down driver.

* * * * *